(12) United States Patent
Vander Plas et al.

(10) Patent No.: US 6,979,906 B2
(45) Date of Patent: Dec. 27, 2005

(54) SOLDER ON A SLOPED SURFACE

(75) Inventors: Hubert Allen Vander Plas, Palo Alto, CA (US); Frank Berauer, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 48 days.

(21) Appl. No.: 10/698,725

(22) Filed: Oct. 30, 2003

(65) Prior Publication Data

US 2004/0180526 A1    Sep. 16, 2004

Related U.S. Application Data

(62) Division of application No. 10/385,487, filed on Mar. 12, 2003, now Pat. No. 6,764,937.

(51) Int. Cl.⁷ .............................................. H01L 29/40
(52) U.S. Cl. ...................... 257/779; 257/773; 257/734
(58) Field of Search ................................ 257/779, 773, 257/734

(56) References Cited

U.S. PATENT DOCUMENTS

| | | | |
|---|---|---|---|
| 4,360,142 A | 11/1982 | Carpenter et al. | |
| 5,492,235 A | 2/1996 | Crafts et al. | |
| 5,736,456 A * | 4/1998 | Akram | 438/614 |
| 5,880,017 A | 3/1999 | Schwiebert et al. | |
| 6,168,973 B1 * | 1/2001 | Hubbard | 438/109 |
| 2002/0028338 A1 | 3/2002 | Li et al. | |

* cited by examiner

*Primary Examiner*—Roy Potter

(57) ABSTRACT

A method for depositing a solder layer or solder bump on a sloped surface. The method includes etching a sloped surface on a planar semiconductor substrate, depositing a solder-wettable layer on the sloped surface, masking the wettabler layer with a coating layer to control the position of the solder deposition, and using an organic film to prevent the solder from being deposited at regions not above either the wettable layer or the coating layer. Also, a semiconductor device structure on which a solder layer or solder bump is formed exclusively on a sloped surface.

14 Claims, 7 Drawing Sheets

SOLDER ON A SLOPED SURFACE

CROSS-REFERENCES TO RELATED APPLICATIONS

This application is a divisional of prior application Ser. No. 10/385,487 filed Mar. 12, 2003 now U.S. Pat. No. 6,764,937.

BACKGROUND

Solder is a material that typically contains tin and lead and that is commonly used during the manufacturing of electronic circuit boards. Solder generally has a lower melting temperature than the metals that may be included, as lines or layers, in the circuit boards. Hence, once two or more metal lines or layers have been formed in a circuit board, solder may be used to form an electrical contact between the layers and/or lines.

FIGS. 1A–1E show cross-sections of semiconductor device structures after various steps of a process for depositing solder on a planar semiconductor substrate surface have been performed according to the related art. FIG. 1A is a cross-sectional view of a semiconductor substrate 100, such as silicon or gallium arsenide, and of an organic film 110, such as a photoresist film, that has been deposited on the semiconductor substrate 100. The organic film 110, according to the related art, is typically spun onto the substrate 100 and is typically in contact with the entire surface of the semiconductor substrate 100.

FIG. 1B is a cross-sectional view of the layers 100, 110 discussed above after the organic film 110 has been selectively etched to form a series of holes 120 (or channels, troughs, grooves, or openings) above the substrate 100. The holes 120 in the organic film 110 may be formed via photo-lithography or by any other process known in the art of semiconductor device manufacturing.

FIG. 1C is a cross-sectional view of the substrate 100 and organic film 110 discussed above after the holes 120 in the organic film 110 have been filled, at least partially, with solder paste 130. Solder paste, in general, typically includes an admixture of flux and solder particles. The solder paste 130 shown in FIG. 1C may be deposited in the holes 120 by any process known in the art. For example, a process similar to the stencil printing process used in the surface mount assembly process can be used. Specifically, a squeegee can be used to "roll" a bead of solder paste 130 across the organic film 110 to deposit the solder paste 130 into the holes 120.

FIG. 1D is a cross-sectional view of the substrate 100 after the solder paste 130 has been heat-treated to form solder bumps 140 on the substrate 100. In order to form the solder bumps 140, the temperature of the solder paste 130 that had been in the holes 120 of the organic film 110 was raised. The higher temperature caused the flux portion that had been in the paste 130 to liquefy and activate the metal surfaces and caused the solder particles in the paste to melt. In the molten phase, the solder will wet to a solderable pad on the substrate surface while the surface tension of the liquid solder will cause the molten solder to form the shape of the solder bump. Upon cooling of the melted solder particles, solid solder bumps 140 were formed. Typically, the temperature of the solder paste 130 is raised by the use of an oven or hot plate.

FIG. 1E is a cross-sectional view of the substrate 100 and the solder bumps 140 after the organic film 110 has been removed. The organic film 110 may be removed by any process that known in the art. Upon removal of the organic film 110, the substrate 100 may have additional structures, such as metal layers and metal lines, deposited thereon, and the solder bumps 140 can be used to electrically connect two or more metal layers or lines.

SUMMARY

A method of depositing solder, the method including the steps of providing a substrate that includes a substantially planar surface and a sloped surface adjacent to the substantially planar surface, forming a wettable layer on a portion of the sloped surface, and forming a solder layer on a first portion of the wettable layer.

A semiconductor device including a substrate having a substantially planar surface and an interior sloped surface, a wettable layer adhered to a portion of the interior sloped surface, and a solder layer adhered to a first portion of the wettable layer.

DESCRIPTION OF THE DRAWINGS

The detailed description will refer to the following drawings, wherein like numerals refer to like elements, and wherein.

DETAILED DESCRIPTION

The following detailed description is presented to enable any person skilled in the art to make and use devices that include solder. For purposes of explanation, specific nomenclature is set forth to provide a thorough understanding of making and using such devices. However, it will be apparent to one skilled in the art that these specific details are not required to make and use the devices. Descriptions of specific applications are provided only as representative examples. Various modifications will be readily apparent to one skilled in the art, and the general principles defined herein may be applied to other embodiments and applications without departing from the spirit and scope of the methods and devices described herein. The methods and devices are not intended to be limited to the embodiments shown, but are to be accorded the widest possible scope consistent with the principles and features disclosed herein.

Historically, solder bumps have been deposited exclusively on substantially planar surfaces, such as the surface of the substrate 100 shown in FIGS. 1A–E and discussed in detail above. However, solder bumps have generally not been deposited on sloped surfaces. Since semiconductor devices typically include both substantially planar and sloped surfaces, the need exists for methods to deposit solder on sloped (i.e., non-planar) surfaces. FIGS. 2A–I illustrate various embodiments of methods of depositing solder and solder bumps on sloped surfaces.

Figure 1A:
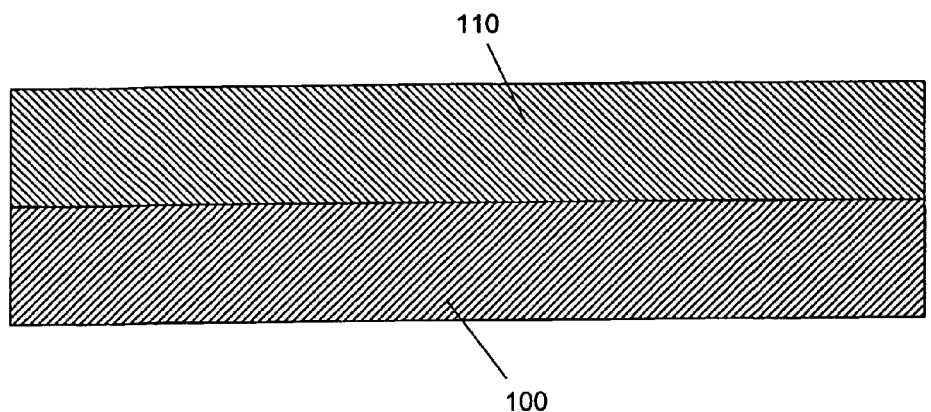
FIGS. 1A–E show the steps of a process for depositing solder on a planar surface according to the related art.
Figure 1B:
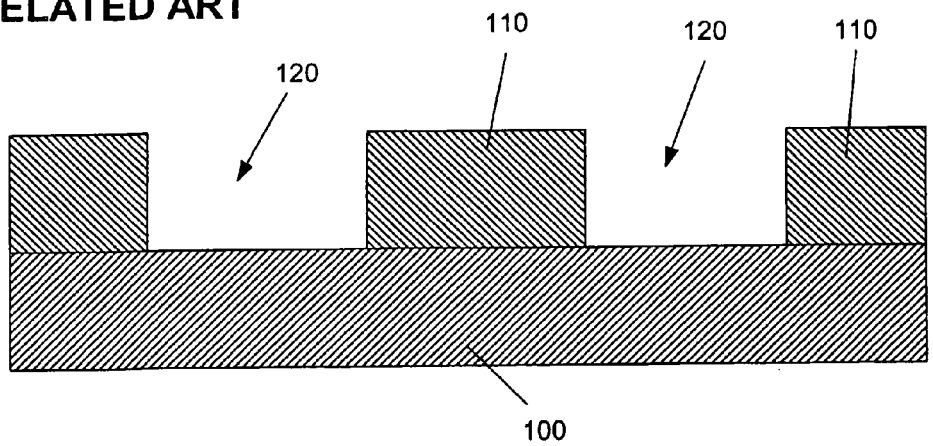
Figure 1C:
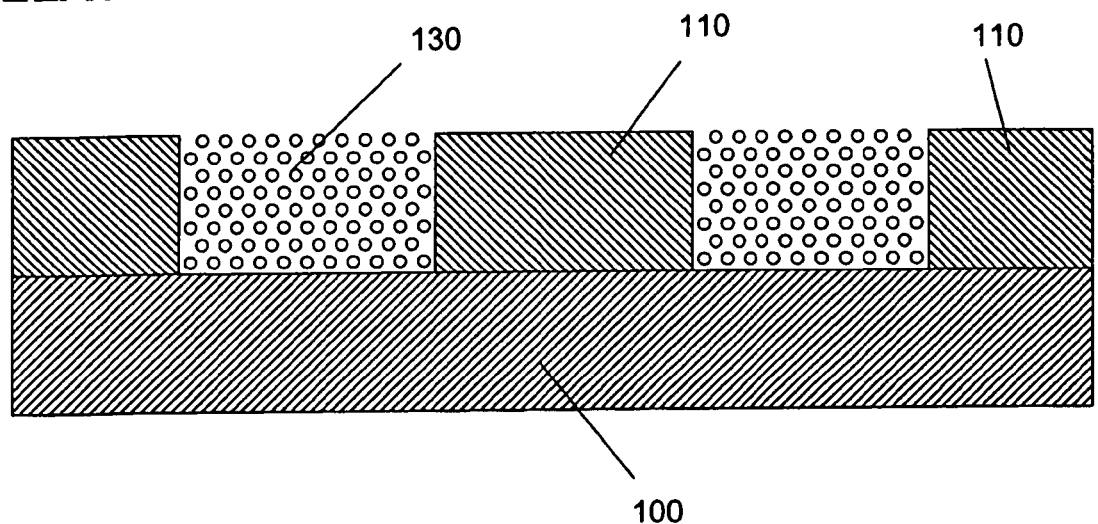
Figure 1D:
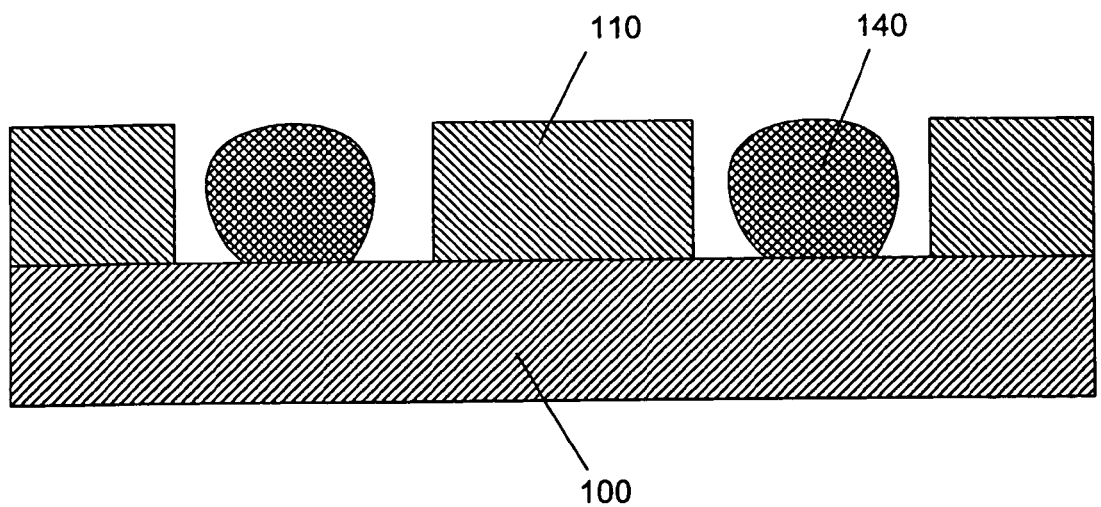
Figure 1E:
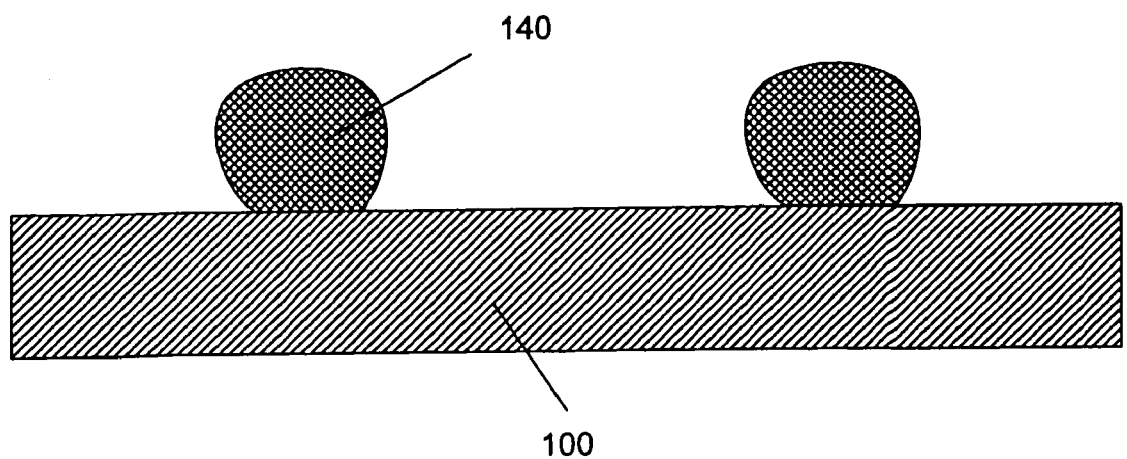
Figure 2A:
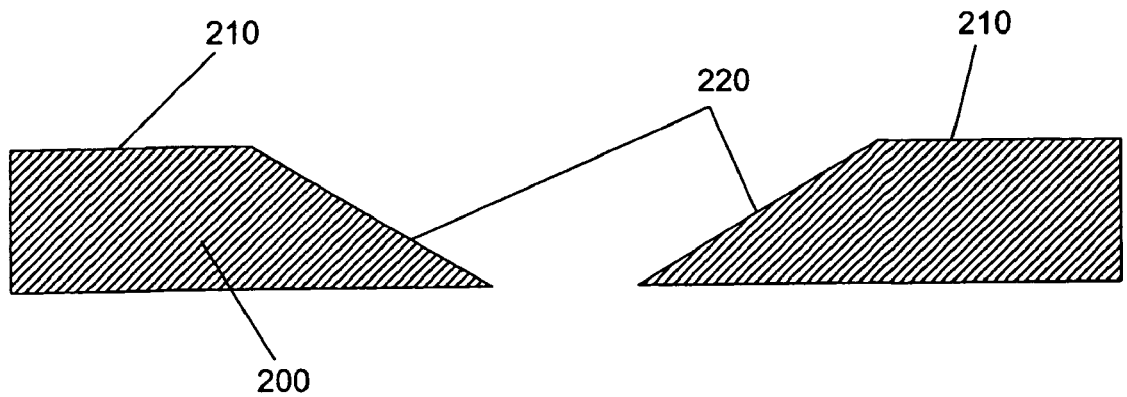
FIGS. 2A–I illustrate steps of a process for depositing solder on a sloped surface.

With reference now to FIG. 2A of the Drawings, there is illustrated a cross-sectional view of a substrate 200 that includes two substantially planar surfaces 210 and two sloped surfaces 220. In some cases, the two sloped surfaces 220 may be on opposite sides of the same square hole or rectangular channel formed in the substrate 200, as is well understood in the art. As shown, each of the sloped surfaces 220 may be positioned adjacent to a substantially planar surface 210 of the substrate 200. The slope of the sloped surfaces 220 relative to the planar surface 210 may be at any angle greater than 0° and less than 90°, measured relative to a line extending horizontally from the planar surface 210. However, the 5°, 10°, 20°, 30°, 45°, 60°, 70°, and 80° angles, plus or minus 2.5°, are preferred in certain embodiments.

The sloped surfaces 220 may be formed by etching the substrate 200. The etching step that forms the sloped surfaces 220 may include anisotropically etching completely through the substrate 200 to form a hole. Alternately, the etching step may form a channel in the substrate 200 and/or may not etch completely through the substrate 200.

Figure 2B:
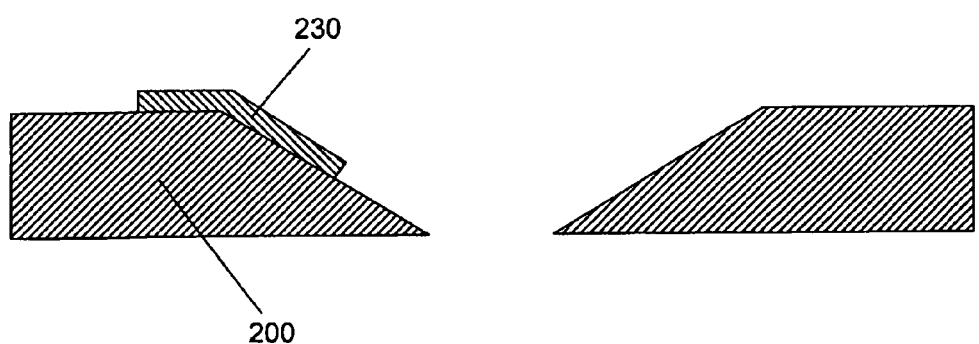

FIG. 2B is a cross-sectional view of the substrate 200 shown in FIG. 2A and of a wettable layer 230 that has been formed on a portion of one of the sloped surfaces 220 of the substrate 200. The wettable layer 230 may include a metal that is wettable by solder (i.e., a metal on which solder can spread evenly, as opposed to beading up on). The wettable layer 230 may be formed by any process known in the art including, but not limited to, evaporation, sputtering, and plasma deposition. Metals that may be included in the wettable layer 230 include, but are not limited to, gold, silver, and copper. Compounds that are solder-wettable may also be used.

As shown in FIG. 2B, the wettable layer 230 may be formed partially on the sloped surface 220 and partially on the planar surface 210 of the substrate 200. In this case, the portion of the wettable layer 230 that is formed on the planar surface 210 of the substrate 200 may be substantially planar. Alternately, the wettable layer 230 may be deposited exclusively on the sloped surfaces 220. The benefits of forming a portion of the wettable layer 230 on the planar surface 210 will become apparent from the discussion below, as will the benefits of forming the wettable layer 230 exclusively on the sloped surface 220.

Figure 2C:
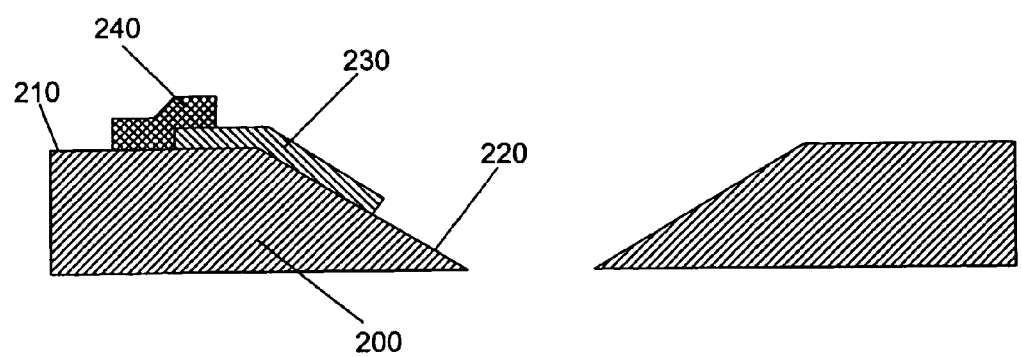

FIG. 2C is a cross-sectional view of the substrate 200 and wettable layer 230 discussed above, after a coating layer 240 has been formed on a portion of the wettable layer 230 and of the substrate 200. The coating layer 240 may include one or more dielectric materials that are not solder-wettable. Such materials include, but are not limited to, oxides, polyimides and solder masks. The coating layer 240 may be formed by any method known in the art and may be thought of as a mask for the wettable layer 230 during solder deposition, as will be seen below.

Figure 2D:
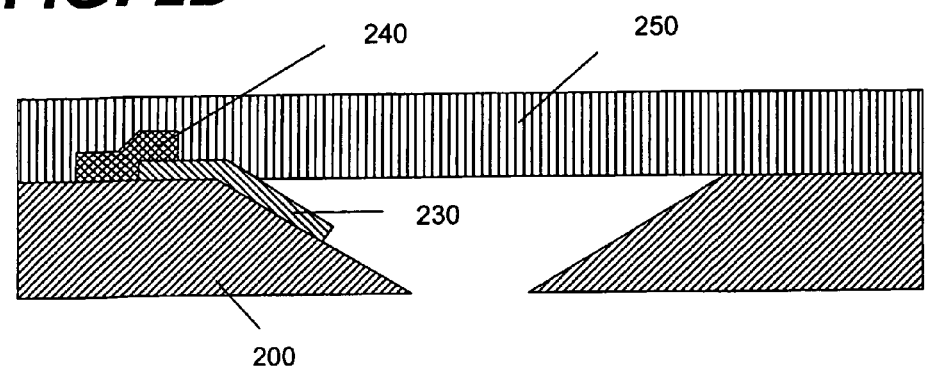

FIG. 2D is a cross-sectional view of the structure shown in FIG. 2C after an organic film 250 or organic layer has been adhered to a portion of the substantially planar surface 210 of the substrate 200. The organic film 250 or layer may or may not be adhered to the wettable layer 230 or the coating layer 240, but may be in contact with both the wettable layer 230 and the coating layer 240. According to certain embodiments of the methods for solder-deposition discussed herein, the organic film 250 is not in contact with the sloped surfaces 220 of the substrate 200. Rather, the organic film 250 forms a bridge over the sloped surfaces 220 and over any hole or cavity that has been etched or otherwise formed in the substrate 200.

A convenient method for substantially preventing the organic film 250 from adhering to or contacting the sloped surfaces 220 of the substrate 200 involves using a rigid or semi-rigid and substantially planar sheet of material as the organic film 250. The sheet may be adhered to the substantially planar surfaces 210 of the substrate 200 after the wettable layer 230 and the coating layer 240 have been formed. Then, because of the inherent rigidity of the substantially planar sheet, the organic film 250 will not dip into the etched portion of the substrate 200 and will therefore not contact the sloped surfaces 220, as shown in FIG. 2D.

No limitations are made on the materials that may be included in the organic film 250. However, polymers that can form thin sheets with enough rigidity to bridge the etched portion of the substrate 200 are preferred. The organic film 250 may be fixed or held in place relative to the substrate 200 via electrostatic forces, a chemical adhesive, and/or mechanical forces. For example, the organic film 250 may be rolled out over the substrate 200 or may be wrapped around the substrate 200 like plastic food wrap around a plate.

Figure 2E:
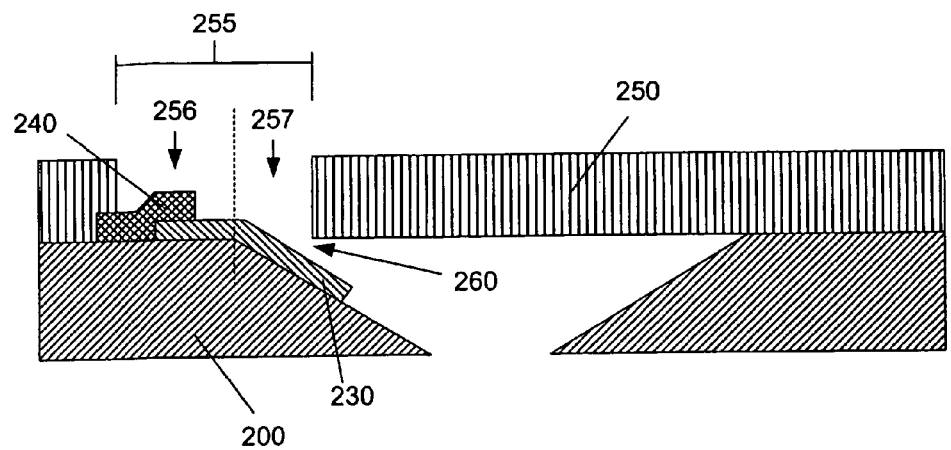

FIG. 2E is a cross-sectional view of the structure shown in FIG. 2D after a section of the organic film 250 has been removed, leaving an empty volume 255 above portions of the wettable layer 230 and coating layer 240. The removed section of the organic film 250 is divided into two portions to facilitate description. The first portion of the removed section, designated by the reference numeral 256, is positioned above one of the planar surfaces 210 of the substrate 200 and contacts a planar portion of the wettable layer 230 before removal. In FIG. 2D, the first portion 256 is supported from underneath by the substrate 200, the wettable layer 230, and the coating layer 240. The second portion of the removed section, designated by the reference numeral 257, is positioned above the etched portion of the substrate 200 before removal and is not supported by the substrate 200. Instead, the second portion 257 of the removed section is bridging the etched portion of the substrate 200.

Subsequent to the removal of the second portion 257, as shown in FIG. 2E, the remaining organic film 250 retains its substantially planar shape and continues to bridge across the etched portion of the substrate 200. In other words, the organic film 250 does not dip or droop into the etched portion of the substrate 200 and does not contact the sloped surface 220. Hence, a gap 260 or unfilled space is formed between the organic film 250 and the wettable layer 230. As shown in FIG. 2E, the gap 260 is formed adjacent to one of the sloped surfaces 220 of the substrate 200.

Figure 2F:
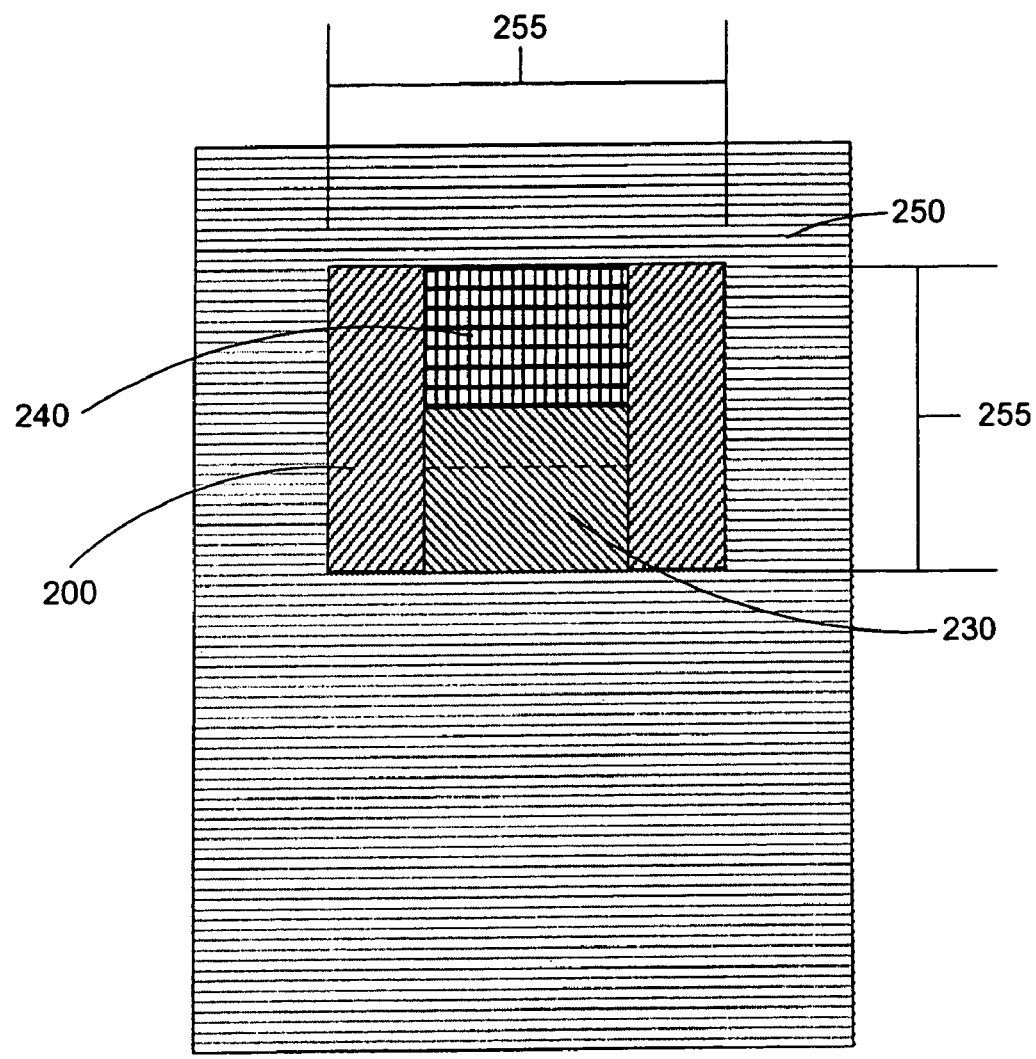

FIG. 2F is a top view of the structure illustrated in FIG. 2E. In this embodiment, the removed section of the organic film 250, represented by the empty volume 255, has a rectangular shape and a width that is slightly larger than the width of the wettable layer 230 and the coating layer 240. Accordingly, the substrate 200 is exposed on both sides of the wettable layer 230 and the coating layer 240.

Figure 2G:
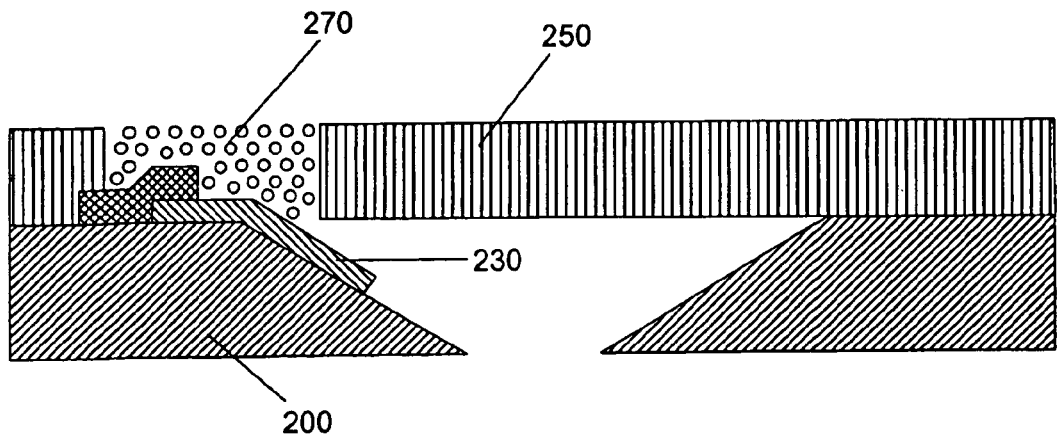

FIG. 2G is a cross-sectional view of the structure illustrated in FIGS. 2E and 2F, after the empty volume 255 has been substantially filled with solder paste 270. The solder paste 270 may be placed in the volume 255 by any means known in the art of semiconductor device manufacturing and does not have to exactly fill the entire volume 255. Any solder paste that is deposited on the organic film 250 may, optionally, be removed after the volume 255 has been substantially filled. Typically, the solder paste 270 is viscous enough and the gap 260 is small enough such that little or none of the solder paste 270 flows through the gap 260 until the solder paste 270 is heated.

Figure 2H:
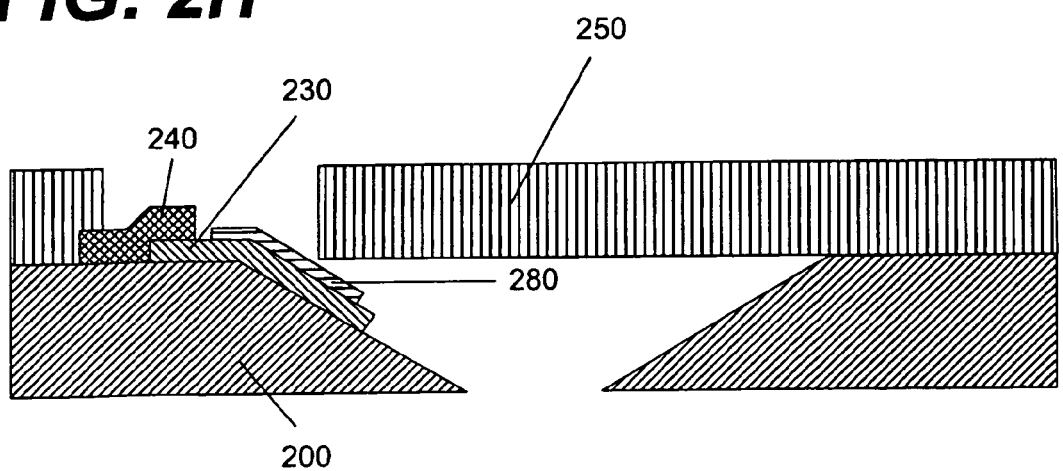

FIG. 2H is a cross-sectional view of the structure shown in FIG. 2G after the solder paste 270 has been heated and processed to form a solder layer 280 on at least a portion of the wettable layer 230. The solder layer 280 may be formed on a portion of or all of the wettable layer 230 that is not covered by the coating layer 240. The solder layer 280 may be formed by thermally treating the solder paste 270 in such a way that the flux in the paste 270 liquifies and activates the metal surfaces and the solder particles in the paste melt together to form the denser solder layer 280. According to certain embodiments of methods for depositing solder, the solder layer 280 may be formed by heating the solder paste 270 to about 180° C. or less, plus or minus approximately 5° C. Although a solder layer 280 is shown in FIG. 2G, solder bumps may also be formed if more solder paste 270 is used, as is understood in the art.

Figure 2I:
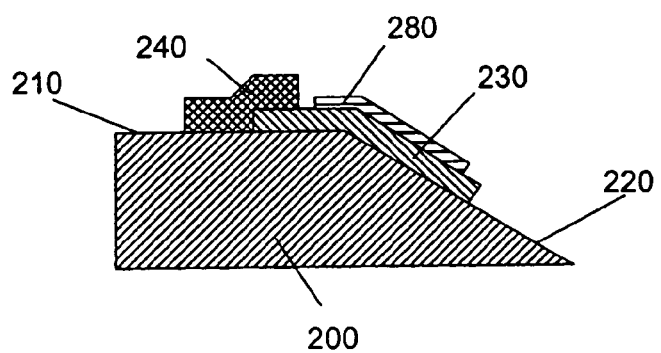

FIG. 2I is a cross-sectional view of the structure shown on the left-hand side of FIG. 2H after the organic film 250 has been removed. The organic film 250 may be removed by any method known in the art such as, but not limited to, chemical dissolution, heating, and application of mechanical force to cause de-lamination.

The structure shown in FIG. 2I includes a substrate 200 having a substantially planar surface 210 and an interior sloped surface 220. Also included is a wettable layer 230, which may include a metal, and that is adhered to a portion of the interior sloped surface. According to alternate structures, the entire wettable layer 230 may be adhered to the sloped surface 220, if desired.

Adhered to a portion of the wettable layer 230 is the solder layer 280. In FIG. 2I, the solder layer 280 is positioned over both a portion of the sloped surface 220 and a portion of the planar surface 210. However, according to alternate structures, the solder layer 280 may be formed and/or positioned exclusively over all or a portion of the sloped surface 220. When the wettable layer 230 is formed over a portion of the planar surface 210, the wettable layer may be used to provide an electrical contact to a line or layer formed on the planar surface 210.

As illustrated in FIG. 2I, a coating layer 240 adheres to a portion of the wettable layer 230. The coating layer 240, during the manufacturing of the structure shown in FIG. 2I, can assist in preventing deposition of the solder layer 280 in undesired locations by effectively masking the wettable layer 230. Once the solder layer 280 has been formed, the coating layer 240 may, optionally, be removed from the structure to facilitate the formation of electrical connections to lines and/or layers on the adjacent planar surface 210.

The coating layer 240 may include any material that is not wettable by solder (i.e., on which solder does not readily spread). For example, the coating layer 240 may include a dielectric material or, more specifically, an oxide. The solder layer 280 may, among other materials, include a tin-bismuth compound or a eutectic, tin-lead compound. However, no particular restrictions are placed on the materials that may be used to build the structure illustrated in FIG. 2I.

While the aforementioned and illustrated methods for forming a solder on a sloped surface have been described in connection with exemplary embodiments, those skilled in the art will understand that many modifications in light of these teachings are possible, and this application is intended to cover any variation thereof.

What is claimed is:

1. A semiconductor device comprising:
   a substrate having a substantially planar surface and an interior sloped surface;
   a wettable layer directly adhered to a portion of the interior sloped surface; and
   a solder layer adhered to a first portion of the wettable layer.

2. The semiconductor device of claim 1, wherein the wettable layer comprises a metal.

3. The semiconductor device of claim 1, wherein the solder layer comprises a tin-bismuth compound.

4. The semiconductor device of claim 1, wherein the solder layer comprises a eutectic tin-lead compound.

5. The semiconductor device of claim 1, wherein the wettable layer is adhered to a section of the substrate, further wherein the wettable layer extends from a first portion of the substantially planar surface to the portion of the interior sloped surface.

6. The semiconductor device of claim 1, wherein the length of the wettable layer is shorter than a length of the interior sloped surface.

7. A semiconductor device comprising:
   a substrate having a substantially planar surface and an interior sloped surface;
   a wettable layer adhered to a portion of the interior sloped surface;
   a solder layer adhered to a first portion of the wettable layer; and
   a coating layer adhered to a second portion of the wettable layer.

8. The semiconductor device of claim 7, wherein the coating layer is a non-wettable layer.

9. The semiconductor device of claim 8, wherein the coating layer comprises a dielectric material.

10. The semiconductor device of claim 7, wherein the wettable layer is adhered to a section of the substrate, further wherein the wettable layer extends from a first portion of the substantially planar surface to the portion of the interior sloped surface.

11. The semiconductor device of claim 7, wherein the length of the wettable layer is shorter than a length of the interior sloped surface.

12. A semiconductor device comprising:
   a substrate having a substantially planar surface and an interior sloped surface;
   a wettable layer adhered to a portion of the interior sloped surface;
   a solder layer adhered to a first portion of the wettable layer; and
   a rigid organic film adhered to a portion of the substantially planar surface of the substrate and adjacent to a portion of the sloped surface.

13. The semiconductor device of claim 12, wherein the wettable layer is adhered to a section of the substrate, further wherein the wettable layer extends from a first portion of the substantially planar surface to the portion of the interior sloped surface.

14. The semiconductor device of claim 12, wherein the length of the wettable layer is shorter than a length of the interior sloped surface.

* * * * *